United States Patent [19]

Melton et al.

[11] Patent Number: 5,086,966

[45] Date of Patent: Feb. 11, 1992

[54] PALLADIUM-COATED SOLDER BALL

[75] Inventors: Cynthia M. Melton, Bolingbrook; Carl J. Raleigh, Cary; Steven Scheifers, Hoffman Estates; William Beckenbaugh, Barrington, all of Ill.

[73] Assignee: Motorola Inc., Schaumburg, Ill.

[21] Appl. No.: 608,872

[22] Filed: Nov. 5, 1990

[51] Int. Cl.$^5$ .............................................. B23K 31/02
[52] U.S. Cl. ................................... 228/208; 228/56.3; 428/570; 428/643; 428/670
[58] Field of Search ............... 228/208, 56.3; 428/570, 428/643, 645, 646, 648, 670; 427/304, 265, 286, 437

[56] References Cited

U.S. PATENT DOCUMENTS

| | | | |
|---|---|---|---|
| Re. 30,348 | 7/1980 | Hascoe | 228/56.3 |
| 3,413,711 | 12/1968 | Brewer et al. | 428/670 |
| 4,011,981 | 3/1977 | Danna et al. | 228/208 |
| 4,020,009 | 4/1977 | Gulla | 427/304 |
| 4,073,981 | 2/1978 | Baron | 427/265 |
| 4,097,266 | 6/1978 | Takahashi et al. | 428/570 |
| 4,279,951 | 7/1981 | Hough et al. | 427/304 |
| 4,463,060 | 7/1984 | Updegraff | 428/670 |
| 4,717,066 | 1/1988 | Goldenberg et al. | 228/179 |
| 4,820,547 | 4/1989 | Lindsay et al. | 427/304 |

OTHER PUBLICATIONS

Marcotte, V. C. et al., "Review of Flip Chip Bonding", *Microelectronics Packaging Technology Materials and Processes,* Proceedings of 2nd ASM International Electronics Materials and Processing Congress, (1989) pp. 73–81.

Amercian Society for Metals, "Welding, Brazing and soldering", *Metals Handbook,* 9th edition, vol. 6 (1983) pp. 1069–1101.

*Primary Examiner*—Kurt Rowan
*Assistant Examiner*—Chuck Y. Mah
*Attorney, Agent, or Firm*—Douglas D. Fekete; Donald B. Southard

[57] ABSTRACT

A body formed of a lead-tin solder alloy is pretreated to deposit palladium thereon prior to soldering to a metallic substrate. It is found that the palladium deposit enhances wetting of the substrate by the solder liquid during reflow and thereby, upon cooling, produces a strong metallurgical bond. In a preferred embodiment, lead-tin solder balls are pretreated by applying tin-palladium colloidal particles and dissociating the particles to form a discontinuous metallic palladium deposit.

5 Claims, No Drawings

PALLADIUM-COATED SOLDER BALL

BACKGROUND OF THE INVENTION

This invention relates to a soldering method that employs a preformed solder body composed of a tin-lead alloy, for example, in attachment of an integrated circuit component to a printed circuit board. More particularly, this invention relates to such method using a tin-lead solder body that includes a palladium deposit to enhance wetting of the substrate metal and thereby produce a strong metallurgical bond even in the absence of rosin flux.

In the manufacture of an electrical component package, it is common practice to assemble components by solder bump interconnections formed from microballs of solder alloy. For example, an integrated circuit chip may be mounted onto a ceramic carrier by an array of solder bumps. Each bump is bonded to a metallic terminal on the chip and also bonded to a metallic terminal on the carrier. In this manner, the solder bumps not only physically attach the components, but also electrically interconnect the terminals to permit electrical signals to be conducted to and from the integrated circuit chip for processing.

Each solder bump interconnection is formed from a singular microsphere of a suitable lead-tin alloy. A solder ball is heated in contact with a terminal of a first component, typically the chip terminal, to reflow the solder alloy onto the terminal metal and, upon cooling, form a solder bump bonded to the terminal. This first component is arranged with the second component with each said bump resting upon a terminal of the second component. In this arrangement, the components are briefly heated to reflow the solder alloy and bond the bump to the second terminal, thereby joining the components into a product assembly.

During each reflow, the liquid solder alloy wets the metal surface of the terminal to provide intimate contact that is necessary to obtain a strong metallurgical bond. To promote wetting of the terminal, a flux is applied to the interface between the solder alloy and the terminal prior to reflow. Rosin flux is particularly well suited to promote wetting, but leaves a residue on the surfaces of the assembly that may interfere with subsequent processing steps or may accelerate corrosion of the solder metal. Accordingly, rosin-fluxed soldering operations are followed by cleaning the assembly with a chlorinated solvent, such as trichloroethylene. This cleaning is complicated by the need to control emission of solvent vapors. Thus, it is desired to eliminate the use of rosin flux and to avoid the subsequent solvent cleaning operation, but without sacrificing intimate wetting of the substrate metal by the solder alloy that is essential to formation of a strong metallurgical bond therebetween.

SUMMARY OF THE INVENTION

In accordance with this invention, it has now been found that reflow of tin-lead solder alloy onto a metal substrate is enhanced by palladium predeposited on the solder surface. In a preferred embodiment, a microsphere of a tin-base lead alloy is pretreated, prior to soldering operations, with an aqeous suspension of tin-palladium colloidal particles, during which colloid particles adhere to the microsphere surface. The surface is then treated with an aqueous fluoboric acid solution to dissociate the palladium-tin colloid and form a dispersed metallic palladium deposit. The palladium-bearing microsphere is placed against the substrate and heated at a temperature and for a time sufficient to liquify the solder alloy, whereupon the liquid alloy flows onto and wets the substrate. Upon cooling to resolidify the alloy, the solder bonds to the substrate. The resulting strong metallurgical bond is indicative of satisfactory wetting that produces intimate contact between the solder liquid and the substrate and is attributed to the presence of the palladium deposit in accordance with this invention, which enhances wetting even in the absence of rosin flux, thereby avoiding contamination of the component surfaces that would otherwise necessitate solvent cleaning following soldering.

DETAILED DESCRIPTION OF THE INVENTION

In accordance with a preferred embodiment of this invention, palladium is deposited onto a surface of a tin-lead solder ball prior to bonding to a clad metallic copper pad carried on a glass base component. Spherically shaped solder balls were commercially obtained having a diameter of about 770 microns. The balls were formed by gas amortization and were composed of about 36 weight percent lead, 2 weight percent silver and the balance substantially tin.

The metallic grey balls in the as-received condition were initially treated in an aqueous palladium-tin colloidal suspension. The suspension was prepared by dissolving palladium dichloride, $PdCl_2$, and stannous chloride, $SnCl_2$, in an acid solution containing 25 volume percent hydrochloric acid. About 1.5 volume percent of an aqueous palladium chloride concentrate was added to the acid solution to produce a palladium concentration of about 0.075 gram per liter. About 8.0 grams per liter of stannous dichloride was added to the solution, whereupon the liquid became gray and opaque indicative of the formation of the desired colloidal suspension. The balls were immersed in the solution with agitation at ambient temperature for about 10 seconds. During immersion, the solder balls became coated with colloidal particles, as evidenced by a change in the appearance of the surface to dull grey.

Following immersion of the colloidal suspension, the solder balls were immersed in an ambient temperature aqueous solution containing about 15 volume percent fluoboric acid, $HBF_4$. Treatment with the fluoboric acid caused the colloidal particles to dissociate, thereby depositing metallic palladium on the surface. The particles were rinsed in methanol and dried at ambient temperature for about 10 minutes. The solder ball surface were examined by energy dispersive x-ray spectroscopy and found to comprise metallic palladium distributed in island deposits.

A solder ball coated with the dispersed palladium deposits was set upon a clean copper pad, heated to about 200° C. and held at that temperature for about 30 seconds to reflow the solder alloy. During heating, the solder alloy forms a liquid phase that wet the copper surface. The elements were cooled to ambient temperature to resolidify the solder alloy. It was found that the solder alloy had spread to form a bump that was tightly bonded to the copper surface.

Thus, this invention produced a strong metallurgical bond between a preformed body of tin-lead solder alloy and a copper substrate. This bonding is attributed to satisfactory wetting provided by the presence of palladium on the solder surface. The bond produced with the palladium deposit was considered to be comparable to bonds formed on copper by the as-received tin-lead balls using rosin flux, but was obtained without rosin flux, thereby avoiding contamination by flux residue that would otherwise necessitate solvent cleaning. In contrast, similar soldering operations preformed on solder balls in the as-received condition without rosin flux and in the absence of a pretreatment to deposit palladium produced a liquid droplet that refused to spread onto the substrate and, upon resolidification, was readily separated from the substrate.

In the described embodiment, the surface of a preformed tin-lead solder body was coated with a discontinuous film of metallic palladium. The discontinuous film was effective to enhance wetting of the copper substrate and a produce strong solder bond. Alternately, the palladium may be deposited as a continuous plate, but involves a greater amount of the precious metal and adds to the expense of the pretreatment. The palladium metal may be deposited by any suitable process, such as electrodeposition.

The method of this invention is particularly well suited for treating a solder ball for use in making a solder bump interconnection for an electronic component package. However, this method is also applicable for treating the surface of tin-lead solder fashioned in shapes other than the microspheres. For example, the surface of a bump affixed to a first surface may be pretreated in preparation for a second solder bonding operation. The solder may be bonded to a suitable metal pad carried on a ceramic, silicon or polymeric base. The solder body may be formed of any suitable alloy composed predominantly of tin and lead. Solder alloys are readily available containing between about 3 and 64 weight percent tin and the balance mainly lead, together with minor amounts of additives such as silver.

While this invention has been described in terms of certain embodiments thereof, it is not intended that it be limited to the above description but rather only to the extent set forth in the claims that follow.

The embodiments of the invention in which an exclusive property or privilege is claimed and defined as follows:

1. In a method for soldering onto a metallic substrate, said method comprising contacting the substrate with a solder body composed of a lead-tin alloy and heating at a temperature and for a time sufficient to reflow the solder alloy onto the substrate, whereby upon cooling the reflowed alloy bonds to the metal substrate, the improvement comprising depositing palladium onto the solder body surface prior to heating the solder alloy in contact with the substrate to enhance wetting of the substrate by the solder alloy during reflow and thereby improve bonding of the solder to the substrate.

2. In a method for solder bonding a tin-lead alloy body to a copper substrate, said method comprising heating the solder body in contact with the substrate at a temperature and for a time sufficient to liquify the solder alloy and cooling to bond the alloy to the metal substrate, the improvement comprising pretreating the solder body to apply a discontinuous palladium deposit prior to heating the solder alloy in contact with the substrate, said deposit being effective to enhance wetting of the substrate by the liquid alloy and thereby improve bonding of the solder to the substrate.

3. In a method for solder bonding a tin-lead alloy body to a copper substrate, said method comprising heating the solder body in contact with the substrate at a temperature and for a time sufficient to liquify the solder alloy and cooling to bond the alloy to the metal substrate, the improvement comprising pretreating the solder body prior to solder contact with the substrate, said pretreatment comprising immersing the body with an aqueous suspension containing palladium/tin colloidal particles to apply said particles onto the surface of the body, and immersing the colloid-coated body in an aqueous fluoboric acid solution to dissociate the colloidal particles and form a discontinuous palladium deposit thereon.

4. A solder ball composed of a suitable tin and lead solder alloy and having a surface, and comprising a palladium deposit on said solder ball surface.

5. A solder ball composed of a tin-base lead alloy and comprising a surface carrying a discontinuous palladium deposit.

* * * * *